US005155749A

United States Patent [19]

DiMilia et al.

[11] Patent Number: 5,155,749

[45] Date of Patent: Oct. 13, 1992

[54] VARIABLE MAGNIFICATION MASK FOR X-RAY LITHOGRAPHY

[75] Inventors: Vincent DiMilia, Carmel; John M. Warlaumont, Chappaqua, both of N.Y.

[73] Assignee: International Business Machines Corporation, Armonk, N.Y.

[21] Appl. No.: 676,501

[22] Filed: Mar. 28, 1991

[51] Int. Cl.$^5$ .................................... G21K 5/00

[52] U.S. Cl. .................................... 378/35; 378/34; 378/145; 378/205; 378/208; 250/491.1; 250/492.2

[58] Field of Search .................... 378/34, 35, 62, 68, 378/145, 205, 208; 250/482.2, 491.1

[56] References Cited

U.S. PATENT DOCUMENTS

| | | | |
|---|---|---|---|
| 4,037,111 | 7/1977 | Coquin et al. | 250/505 |
| 4,384,919 | 5/1983 | Casey | 156/645 |
| 4,634,643 | 1/1987 | Suzuki | 430/5 |
| 4,887,283 | 12/1989 | Hosono | 378/35 |
| 4,950,568 | 8/1990 | Kraus | 378/35 |
| 4,964,145 | 10/1990 | Maldonado | 378/35 |

*Primary Examiner*—Constantine Hannaher
*Assistant Examiner*—Kim-Kwok Chu
*Attorney, Agent, or Firm*—John J. Goodwin

[57] ABSTRACT

An X-ray mask structure for X-ray lithography which can be adjusted by applied force to provide variable magnification of a pattern on the mask membrane. The applied force is provided by the heat expansion of a deformable member and the resultant stress on a support ring. A circular patterned mask membrane is supported in a ring composed, for example, of silicon or silicon-pyrex. The support ring contains a concentric aluminum ring having an embedded circular heating element. The heating element causes expansion of the aluminum ring which causes mechanical stress in the support and expansion of the mask membrane. Expansion of the mask membrane results in a corresponding magnification of the pattern thereon.

1 Claim, 1 Drawing Sheet

VARIABLE MAGNIFICATION MASK FOR X-RAY LITHOGRAPHY

BACKGROUND OF THE INVENTION

1. Field of the Invention

The present invention relates to X-ray masks and the like, and more particularly to an X-ray mark wherein the magnification property can be varied.

2. Description of the Prior Art

U.S. Pat. No. 4,037,111, issued Jul. 19, 1977 to Coquin et al, entitled MASK STRUCTURES FOR X-RAY LITHOGRAPHY, describes various techniques and metallization systems for minimizing the establishment of stresses which cause distortion in X-ray masks.

U.S. Pat. No. 4,384,919, issued May 24, 1983 to Casey, entitled METHOD OF MAKING X-RAY MASKS, discloses an X-ray mask made by forming a thin polymide membrane on a silicon wafer substrate which is then back-etched to form a mask supporting ring of the substrate.

U.S. Pat. No. 4,634,643, issued Jan. 6, 1987 to Suzuki, entitled X-RAY MASK AND METHOD OF MANUFACTURING THE SAME, describes a mask for X-ray exposure composed of an X-ray absorbing layer of tungsten having a desired pattern, a membrane transparent to X-ray and supporting the X-ray absorbing layer, a frame member reinforcing and supporting the membrane at the periphery thereof and films of titanium and/or nickel provided between the membrane and the X-ray absorbing layer. The mask makes it possible to obtain an accurate replication of extremely fine patterns and the desired pattern of the mask can be prepared by the direct dry etching of the X-ray absorbing layer using a resist pattern as the etching mask.

SUMMARY OF THE INVENTION

An object of the present invention is to provide a simple technique to improve magnification matching between masks and wafers in an X-ray lithography system.

Another object of the present invention is to provide a mask for X-ray lithography which can be adjusted by applied force to produce variable magnification properties.

A further object of the present invention is to provide a mask for X-ray lithography which includes a membrane as a support ring wherein the membrane may be selectively expanded by an applied force to vary the magnification for error compensation.

DESCRIPTION OF A PREFERRED EMBODIMENT

Figure 1:
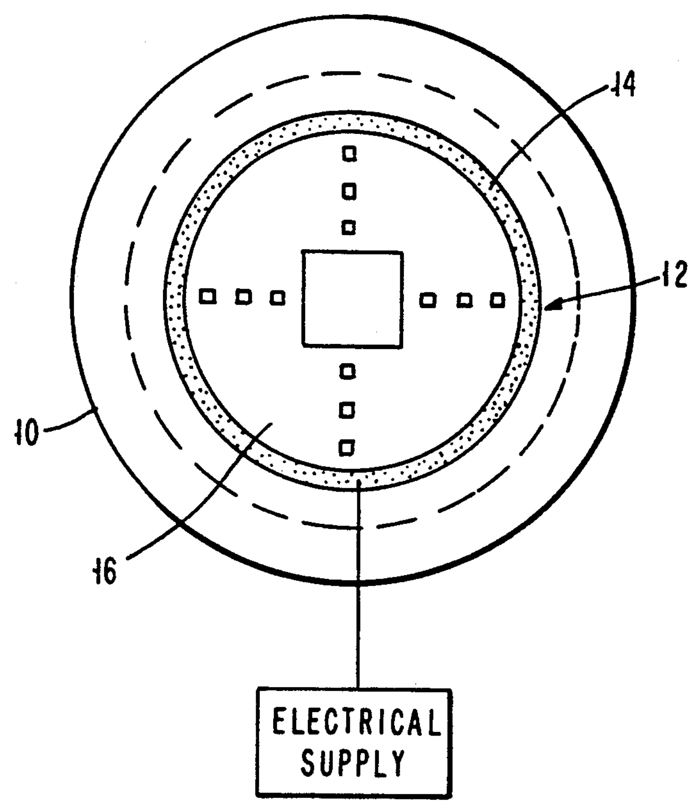
FIG. 1 is a plan view of an illustration of an embodiment of an X-ray mask according to the principles of the present invention.
Figure 2:
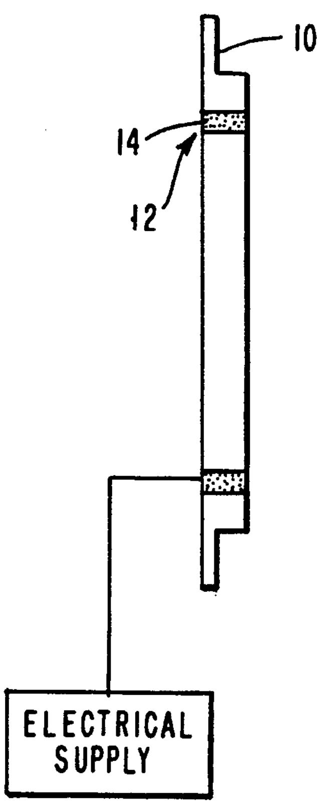
FIG. 2 is a side view of the embodiment of the present invention illustrated in FIG. 1.

Referring to FIGS. 1 and 2, top and side views are shown of an embodiment of an X-ray mask structure for X-ray lithography which can be adjusted by applied force to provide variable magnification of a pattern on the mask membrane. In the embodiment of FIGS. 1 and 2, the applied force is provided by the heat expansion of a deformable member and the resultant stress on a support ring. A circular patterned mask membrane 16 is supported in a ring 10 composed, for example, of silicon or silicon-pyrex. Support ring 10 contains a concentric aluminum ring 14, having an embedded circular heating element 12. Heating element 12 causes expansion of aluminum ring 14 which causes mechanical stress in support 10 and expansion of mask membrane 16. Expansion of mask membrane 16 results in a corresponding magnification of the pattern thereon.

X-ray lithography techniques are used to achieve high density mounting and miniaturization in the field of semiconductor devices such as LSI, IC. X-ray lithography techniques are used because an X-ray has a quite short wave length. The method of X-ray lithography employs a soft X-ray generated from a metallic target by colliding an electron beam, and irradiates the X-ray through an X-ray mask on a resist applied to a major surface of a semiconductor wafer to form fine patterns. It is well known that the X-ray lithography technique permits to prevent the shading of the pattern due to the diffraction and interference of light, because X-ray has a quite short wave length, to reduce proximity effect because of low scattering property of X-ray in the resist and substrate compared to other light source such as electron beam and to form patterns without affection of the external field or the charge carried by the resist or the substrate.

In the X-ray pattern transfer technique, it is necessary to use an X-ray mask as mentioned above. In order to produce an accurate pattern of submicron order, the mask must satisfy a lot of strict requirements.

The X-ray mask conventionally used comprises a thin film, that is, membrane transparent to soft X-ray having a wave length of several angstroms to 10 angstroms, an X-ray absorbing layer formed on the thin membrane and composed of a heavy metal such as Au (gold), Pt (platinum) having high X-ray absorbance and a frame supporting and fixing the thin membrane at the periphery thereof and composed of single crystal of Si (silicon), quartz glass or the like.

In the use of X-ray lithography, when the patterns written on a number of X-ray mask membranes are projected by the X-rays onto a silicon device substrate, the precision of the placement and dimensions of these patterns is important to the subsequent operation of the fabricated circuits. Various factors in the manufacture of the masks or in the processing of the device wafers can lead to magnification and overlay errors between successive levels. The mask structure as shown in FIGS. 1 and 2 provides a means of adjusting the size of the X-ray mask to compensate for such errors, and to maximize the overlay precision. The mask structure includes a silicon-pyrex composite or solid silicon support ring 10. A concentric ring 14 having an embedded heating element 12 is fabricated into the mask structure as shown in FIG. 1. The concentric ring 14 has a high thermal coefficient of expansion as compared to the silicon or the pyrex of support 10. The concentric ring 14 may be composed of aluminum. A thin film X-ray transparent mask membrane 16 is supported in the center of support ring 10 and concentric ring 14. The mask membrane 16 includes an X-ray opaque pattern thereon. A small current through the heating element 12 provided by electrical source 18 will cause the concentric ring 14 to expand. This in turn will apply a mechanical stress on the mask structure causing the mask membrane 16 to expand inducing a magnification of the pattern on the membrane 16.

Figure 3:
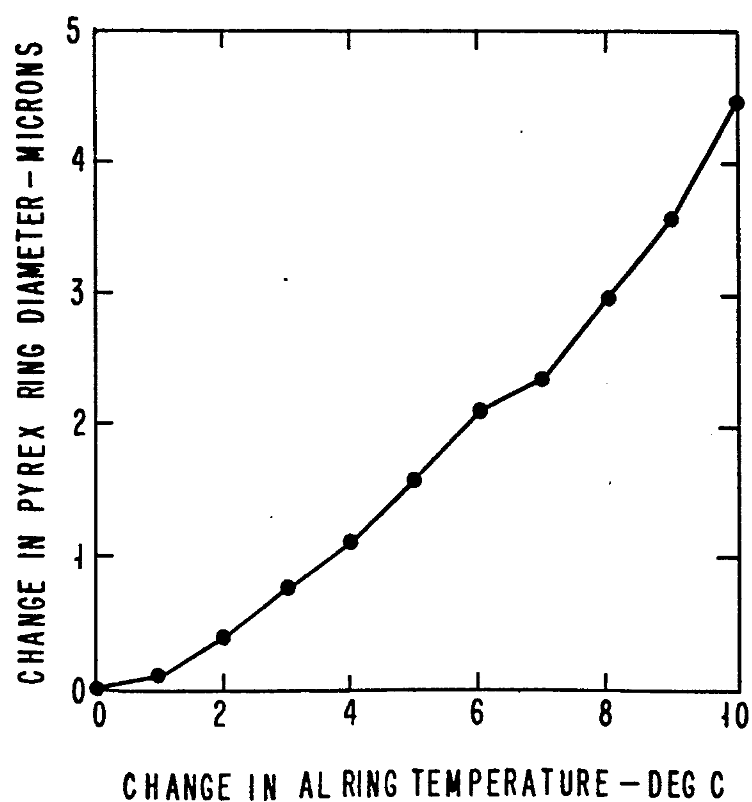
FIG. 3 is a curve illustrating the variation of the X-ray mask membrane in response to changes in temperature.

FIG. 3 is a curve showing the relatioship between the measured expansion of an X-ray mask membrane 16 and the temperature of ring 14 using the technique described herein. The temperature of the ring 14 and the corresponding expansion and stress on membrane 16 can be selectively controlled by the amount of current provided by electrical source 18. Thus, the magnification property of the membrane and its matching to a wafer can be selectively controlled.

The function performed by the ring 14 and embedded heating element 12 is the production of a physical force concentric to the support ring 10 to produce stress. In the embodiment of FIG. 1, the force was produced by the expansion (deformation) of concentric ring 14 by heat. Other deformable means for producing a physical force are also contemplated within the invention. For example, in another embodiment, a concentric ring 14 may be composed of piezoelectric material which is caused to expand due to an electric input signal applied thereto. Likewise, concentric ring 14 may be embodied as a deformable bladder similar to an inner tube which expands and produces the desired force by the introduction of gas or hydraulic fluid or the like.

One skilled in the art will appreciate that the types of materials discussed relative to the embodiments are only by way of example. Likewise, the fact that the structure is circular and that the expansion ring is concentric with the support ring is also for purposes of example. In particular designs, it may be found that a concentric oval structure may be used, or square or rectangular configurations employed to provide differential expansions in separate directions.

The generic feature is the combination of a member which is selectively and controllably deformable or expandable to produce mechanical stress on a radiation beam mask, for example, an X-ray mask, to effect changes in magnification of the mask.

While the invention has been shown with respect to particular embodiments thereof, it will be apparent to those of skill in the art that variations can be made therein without departing from the spirit and scope of the present invention. For example, those of skill in the art will foresee additional applications of this technique to produce many different structures, some of which may be novel.

Having thus described our invention what we claim as new and desire to secure as Letters Patent, is:

1. A variable magnification mask structure for a radiation beam system comprising:

a membrane structure containing a given pattern thereon and adapted to be disposed in the path of a radiation beam for modifying said beam in accordance with said pattern, a support member for said membrane structure wherein said membrane is enclosed within and supported by said support member, a deformable member disposed within said support member, said deformable member adapted to produce a force on said support member to cause said support member to mechanically stress and produce a corresponding physical change in size of said membrane wherein said change in size of said membrane causes a change in the said radiation beam modification produced by said membrane wherein said support member is an annular ring and wherein said deformable member disposed within said annular support ring is an expandable flexible bladder, wherein said membrane is a circular thin film transparent to said radiation beam supported within said annular support ring and having a given pattern of material thereon opaque to said radiation beam, and wherein said variable magnification mask structure further includes means connected to said flexible bladder to introduce a fluid substance into said flexible bladder to expand said flexible bladder to produce said stress force on said support member.

* * * * *